United States Patent
Pan (10) Patent No.: US 7,616,931 B2
(45) Date of Patent: Nov. 10, 2009

(54) SYSTEM AND METHOD FOR REDUCING PHASE DISTORTION IN A LINEAR TRANSMITTER

(75) Inventor: Meng-An Pan, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 649 days.

(21) Appl. No.: 10/986,141

(22) Filed: Nov. 12, 2004

(65) Prior Publication Data

US 2006/0052071 A1 Mar. 9, 2006

Related U.S. Application Data

(60) Provisional application No. 60/606,924, filed on Sep. 3, 2004.

(51) Int. Cl.
*H04B 1/04* (2006.01)

(52) U.S. Cl. .................. 455/127.3; 455/114.3; 330/252

(58) Field of Classification Search .............. 455/127.1, 455/280, 293, 334, 550.1, 114.2, 114.3, 127.2, 455/127.3; 330/252, 261, 277, 285
See application file for complete search history.

(56) References Cited

U.S. PATENT DOCUMENTS

| | | | | |
|---|---|---|---|---|
| 3,739,292 A | * | 6/1973 | Furuhashi | 330/263 |
| 5,565,813 A | * | 10/1996 | Connell et al. | 330/9 |
| 6,028,598 A | * | 2/2000 | Suyama et al. | 345/211 |
| 6,812,771 B1 | * | 11/2004 | Behel et al. | 327/359 |
| 7,039,381 B2 | * | 5/2006 | Yang et al. | 455/292 |
| 7,145,390 B2 | * | 12/2006 | Pan | 330/261 |
| 7,184,735 B2 | * | 2/2007 | Bhatti et al. | 455/292 |
| 7,199,659 B2 | * | 4/2007 | Pan | 330/252 |
| 2003/0011434 A1 | * | 1/2003 | Luo et al. | 330/281 |
| 2003/0067359 A1 | * | 4/2003 | Darabi et al. | 331/46 |
| 2006/0050809 A1 | * | 3/2006 | Pan | 375/297 |

* cited by examiner

Primary Examiner—Nhan T Le (57) ABSTRACT

The invention decreases phase distortion in a transmitter by balancing C load in the power amplifier input such that a PGA won't have phase distortion.

11 Claims, 7 Drawing Sheets

SYSTEM AND METHOD FOR REDUCING PHASE DISTORTION IN A LINEAR TRANSMITTER

CROSS REFERENCE TO RELATED APPLICATION

This application claims priority to and incorporates by reference U.S. Patent Application No. 60/606,924, filed Sep. 3, 2004, entitled "LINEAR IN-PHASE TRANSMITTER DESIGN" by inventor Meng-An Pan.

BACKGROUND

1. Technical Field

This invention relates generally to wireless communication systems, and more particularly, but not exclusively, to a linear in-phase transmitter.

2. Description of the Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to RF carrier in accordance with the particular wireless communication standard and directly or in one or more intermediate frequency stages to produce the RF signals.

The IEE 802.11g standard uses Orthogonal Frequency Division Multiplexing (OFDM) modulation that has data information in both the amplitude and phase. In order not to degrade the modulation quality, the transmitter has to be operated 10 dB lower than the 1 dB compression point of the transmitter. That is, the operating output power backs off by 10 dB of its 1 dB compression point. The design target is to send out 5 dBm output power, which means the transmitter has to be linear up to 15 dBm. That is, the transmitter and thus the power amplifier driver (PAD) (the last stage of the transmitter) has to be designed with output 1 dB compression point equal to or more than about 15 dBm. A balun coupled to the PAD combines the differential signal and then sends it to a power amplifier if extra output power is required.

The design of a power amplifier driver (PAD) can be classified as class A, class AB, class B, class C, et cetera when biased at different current levels. In some designs, a programmable gain amplifier (PGA) is coupled to and drives a PAD. Small and big swings in the PGA output cause PAD to present different capacitive loads to the PGA, which causes PGA phase distortion in the time frame. Since information is carried by both amplitude and phase, phase distortion will make the transmitter non-linear.

Accordingly, a system and method are needed in designing the PAD such that it presents a constant capacitive load for its previous stage PGA. The PGA and hence the whole transmitter can then have linear in phase response.

SUMMARY

Embodiments of the invention enable the power amplifier to present a constant capacitive load to PGA in order for PGA to overcome phase distortion, thereby maintaining phase linearity.

In one embodiment of the invention, a power amplifier comprises two sets of differential pairs and a differential inductor. The differential inductor is coupled to each of the differential pairs. Each of the differential pairs receives a bias voltage that in combination balances the Capacitance load (C load), which is the PAD input capacitive load presented to PGA, for its driving stage (PGA in this case). In an embodiment of the invention, the one pair is biased at Class AB and one pair is biased at close to class B.

In one embodiment of the invention, the method comprises using two sets of differential pairs for the power amplifier; and supplying different bias voltages to the differential pairs that in combination present a balanced C load to its driving stage PGA.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
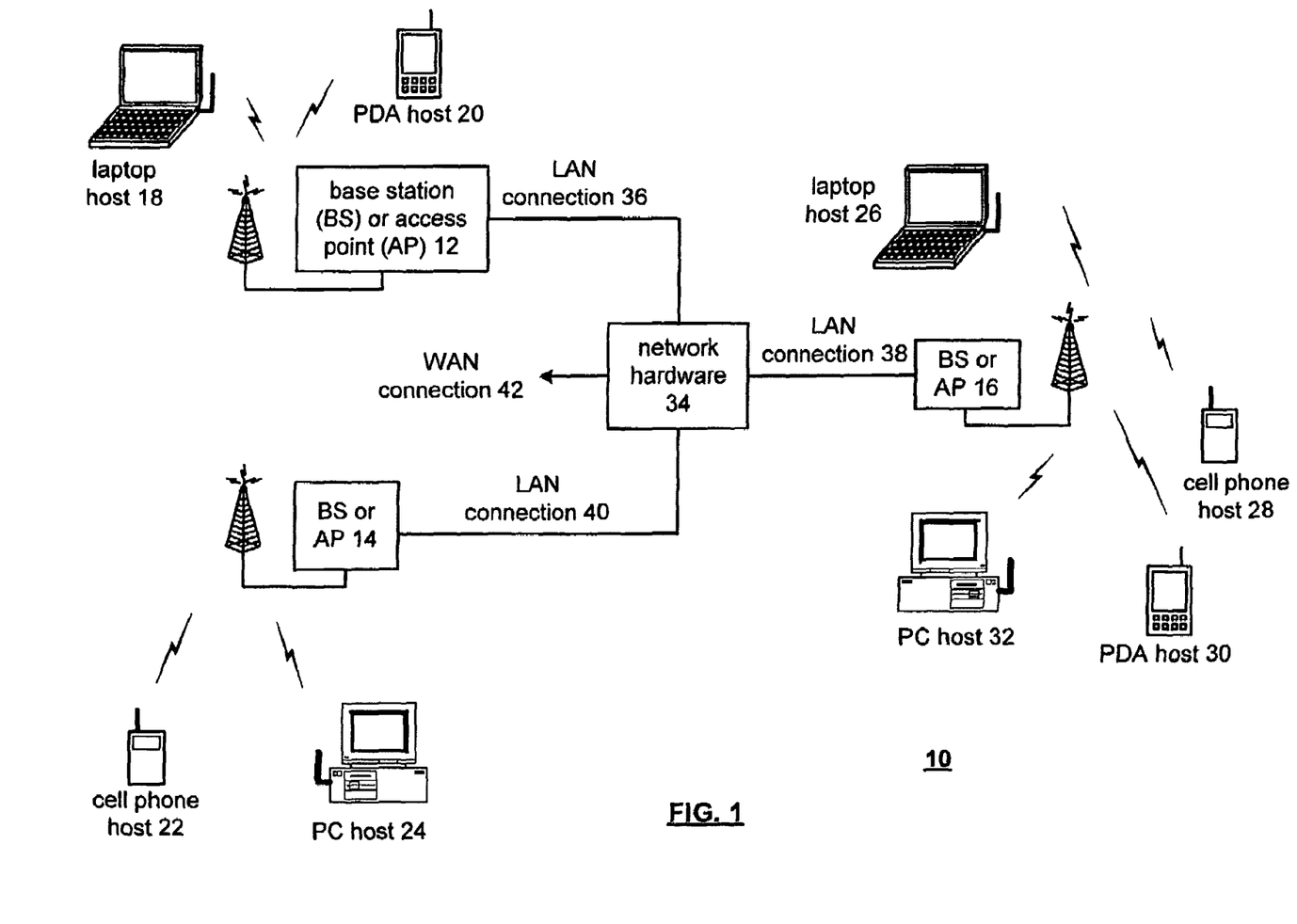
FIG. 1 is a block diagram illustrating a network system according to an embodiment of the present invention.

FIG. 1 is a block diagram illustrating a network system 10 according to an embodiment of the present invention. The system 10 includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28.

The base stations or access points 12 are operably coupled to the network hardware 34 via local area network connections 36, 38 and 40. The network hardware 34, which may be a router, switch, bridge, modem, system controller, etc. provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a transmitter capable of adjusting power amplifier output power.

Figure 2A:
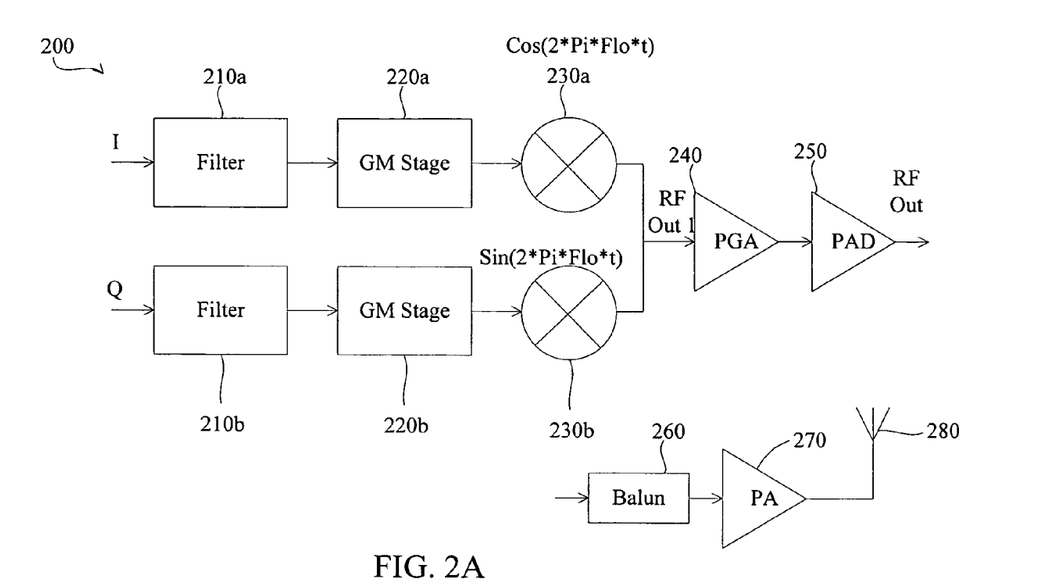
FIG. 2A is a block diagram illustrating a section of a transmitter.

FIG. 2A is a block diagram illustrating a section of a transmitter 200. The transmitter 200 includes digital to analog processing circuitry (not shown), communicatively coupled to I and Q branches. The I and Q branches each include a filter 210a and 210b respectively, a Gm stage 220a and 220b respectively and a mixer 230a and 230b respectively. The mixers 230a and 230b are communicatively coupled to a programmable gain amplifier (PGA) 240, which is communicatively coupled to a power amplifier driver (PAD) 250, which is communicatively coupled to a balun 260, which is communicatively coupled to a power amplifier 270, which is communicatively coupled to an antenna 280. The PAD 250 acts as a power amplifier (PA) and is referred to as a PAD to distinguish it from the PA 270.

After digital to analog processing, as is known in the art, the filters 210a and 210b, which may include low pass filters, filter the I and Q currents. The GM stages 220a and 220b then convert the voltage signals into current signals, which are up converted into 2.5 GHz signal via the mixers 230a and 230b in one embodiment. The PGA 240 provides the gain that amplifies the signals, and the PAD 250 then drives the balun 260 that combines the differential output signal into a single ended signal. The balun 260 presents a load of 50 ohm to each side of the PAD 250. An external power amplifier 270 can be used if more output power (more than 5 dBm) is required.

Figure 2B:
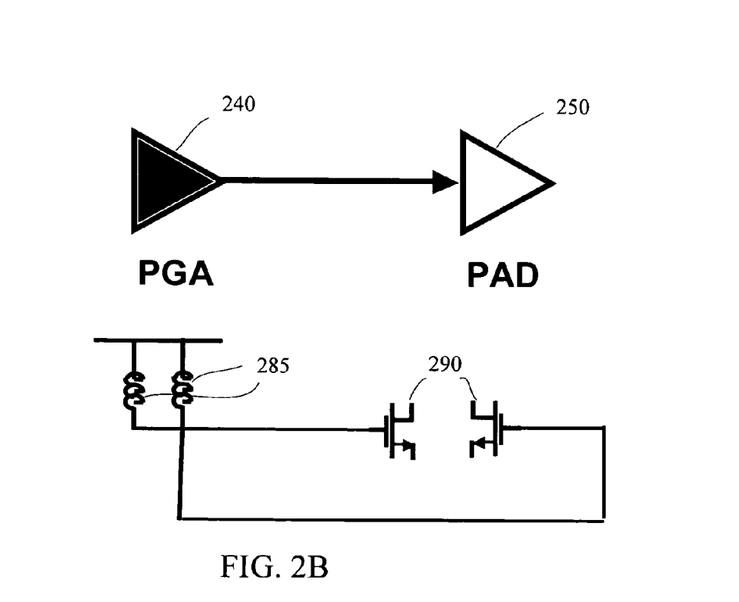
FIG. 2B is a block diagram illustrating a programmable gain amplifier (PGA) coupled to a PAD of the transmitter of FIG. 2.

FIG. 2B is a block diagram illustrating the PGA 240 coupled to the PAD 250. Output from inductors 285 of the PGA 240 is fed into differential pairs 290 of the PAD 250. PAD input gate capacitance (C load) will be shown to be a function of the PAD operating point and the PGA output (PAD input) amplitude. As will be discussed in further detail below, the variation of C load as a function of the amplitude will cause the PGA to show different phase delay over different amplitudes, i.e., phase distortion. In order to reduce phase distortion, the PAD 250 is biased such that the C load presented to PGA is constant regardless of output from the inductors 285.

Figure 3A:
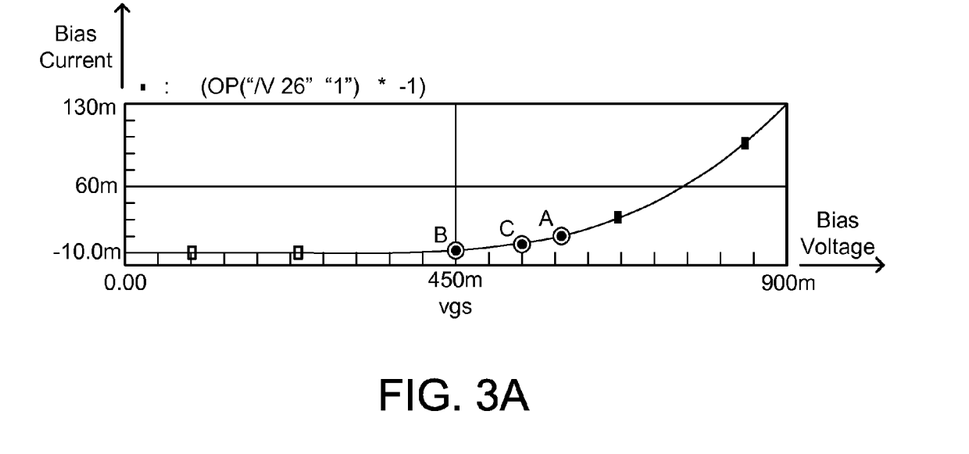
FIG. 3A-F are graphs illustrating PAD input gate capacitance is capacitive load (C load) for PGA and how C load is a function of PAD input DC bias and PGA output (PAD input) amplitude. It also shows how the PGA phase was distorted with a different C load.
Figure 3B:
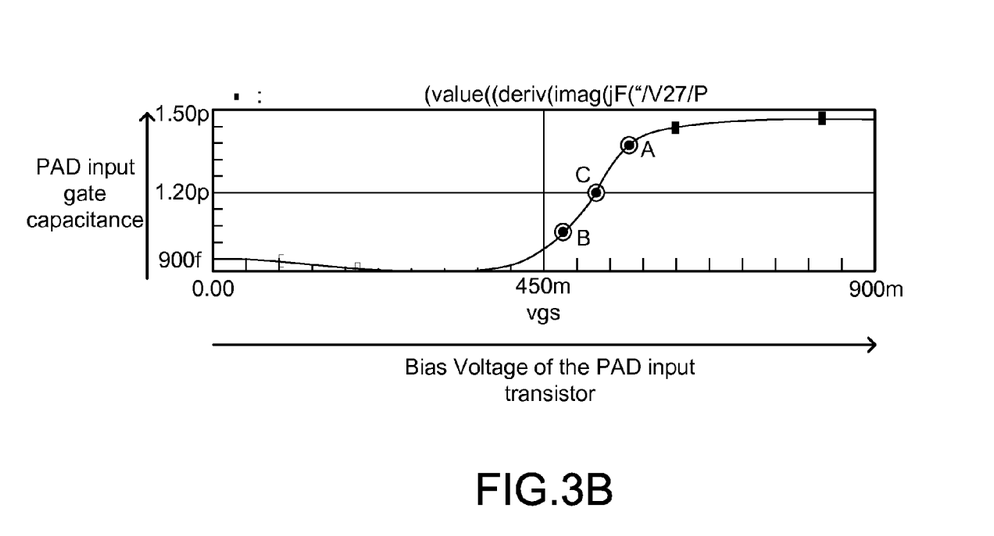
Figure 3C:
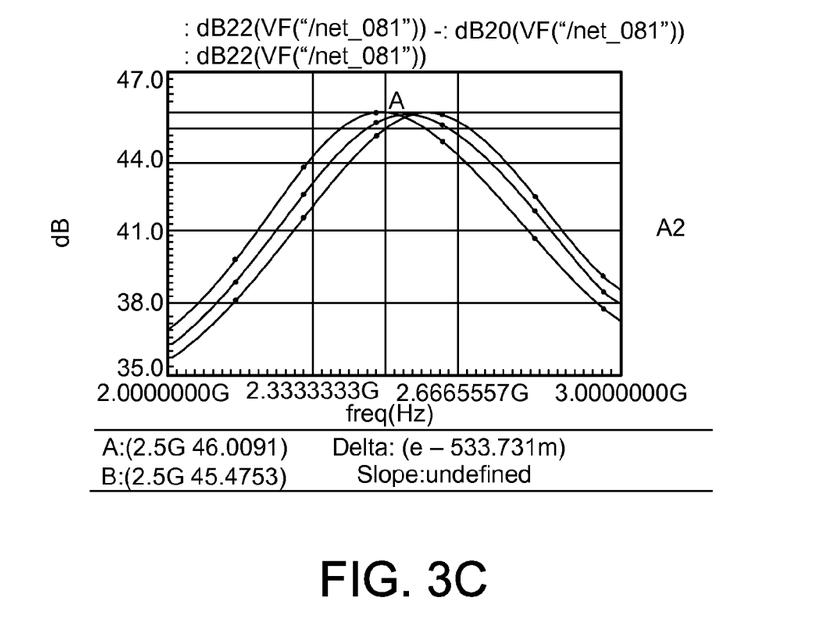
Figure 3D:
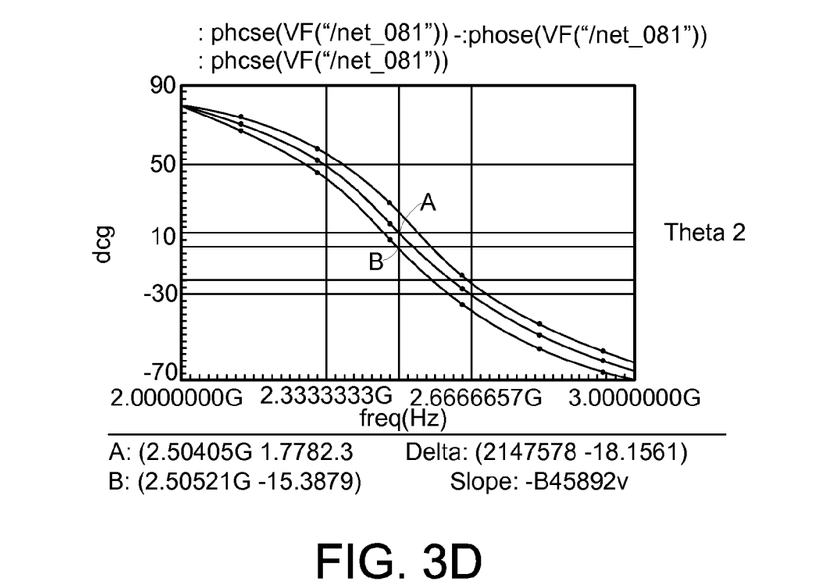
Figure 3E:
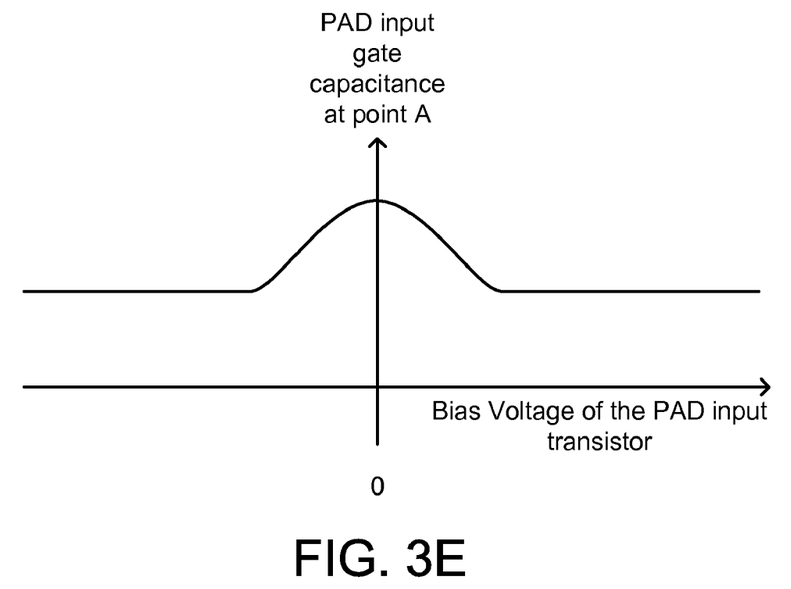
Figure 3F:
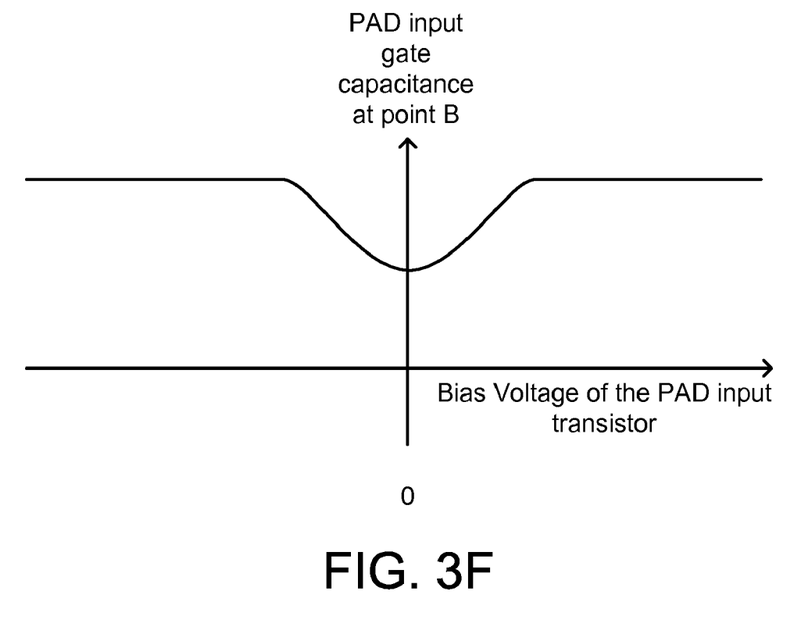

FIG. 3A-F are graphs illustrating operation of the PAD 250. FIG. 3A shows bias current at the differential pair 290 versus operating bias voltage. Operating points A, B, and C are specified. Operating point A is such that the PAD is a class AB design and B is such that the PAD is a close to class B design. FIG. 3B shows C load (MOS gate capacitance of the PAD differential pair) versus operating bias voltage. Operating points A, B, and C are specified. FIG. 3E shows the C load is a function of the amplitude at operating point A. FIG. 3F shows the C load is a function of the amplitude at operating point B. At operating point A, the C load decreases as PGA 240 output signal amplitude (PAD input signal amplitude) increases and is not linear over the amplitude range. At operating point B (bias current is close to 0), the C load decreases as PGA 240 output signal amplitude (PAD input signal amplitude) increases and is not linear over the amplitude range. As can be seen, depending on how the PAD is biased, C load is a different function of the PAD input bias voltage and PGA output amplitude. These different C loads affect the magnitude gain as shown in FIG. 3C and to a greater extent, phase gain, as shown in FIG. 3D.

Figure 4:
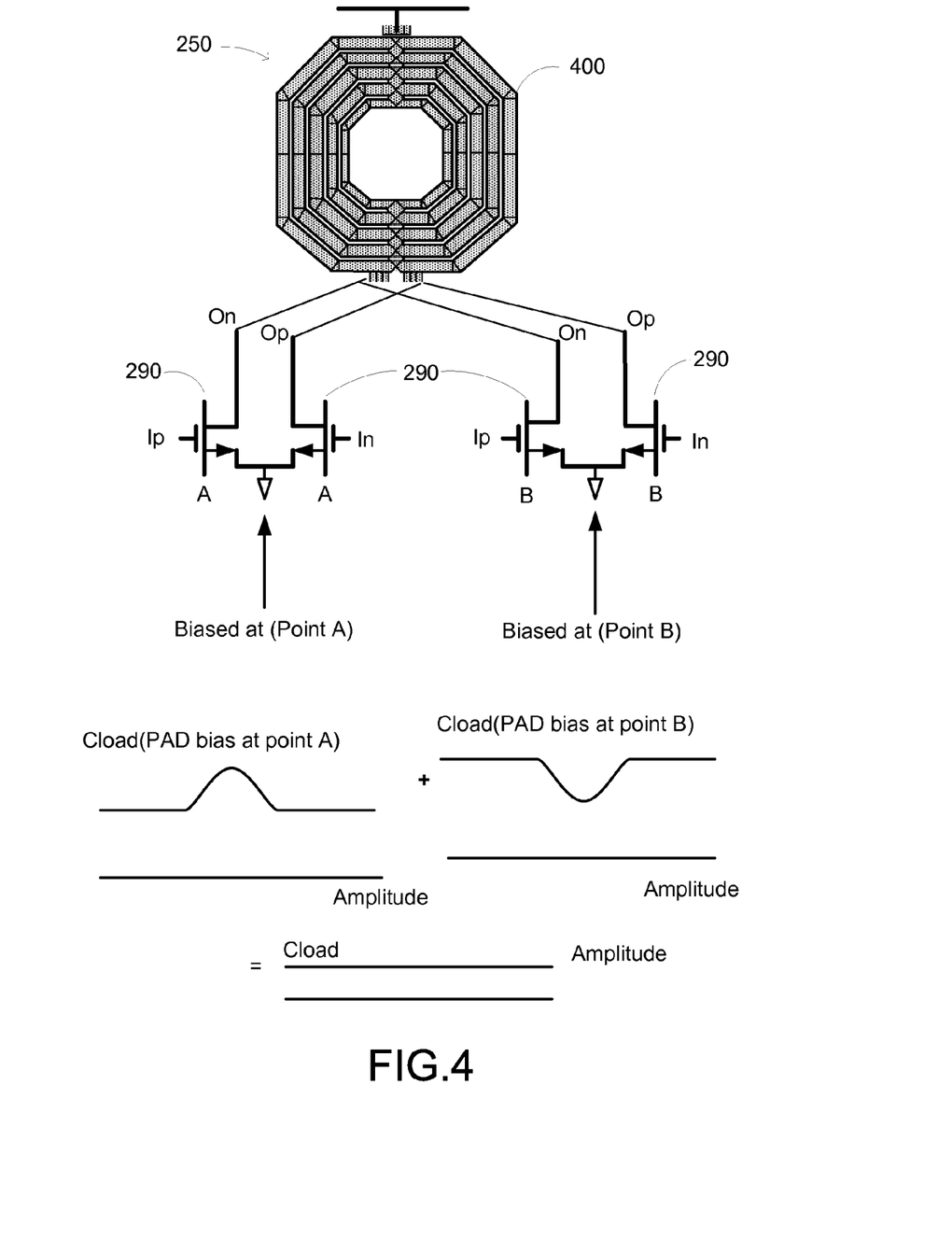
FIG. 4 is a diagram illustrating the power amplifier driver.

FIG. 4 is a diagram illustrating the power amplifier driver 250. The PAD 250 comprises two differential pairs (having two branches each, one positive, one negative) coupled to a differential inductor 400. At about 2.5 GHz (the operating frequency, the transmitter band is around 2.5 GHz), the imaginary part of the impedance is 0 and the real part of the impedance is about 200. With the inductor 400 tunes out whatever capacitive load at 2.5 GHz, the equivalent load seen by the PAD is an impedance of 200+j*0. That is the PAD output sees a load impedance with real part=200 and imaginary part=0. Bias transistors in the differential pairs 290 supply bias voltage to the power amplifier driver 250. Specifically, the design biases transistors in one pair (290A) at operating point A while biasing transistors in the other pair (290B) at operating point B. Accordingly, the pairs generate C load that balance each other out as is shown and therefore prevents phase distortion for its driving stage PGA.

Figure 5:
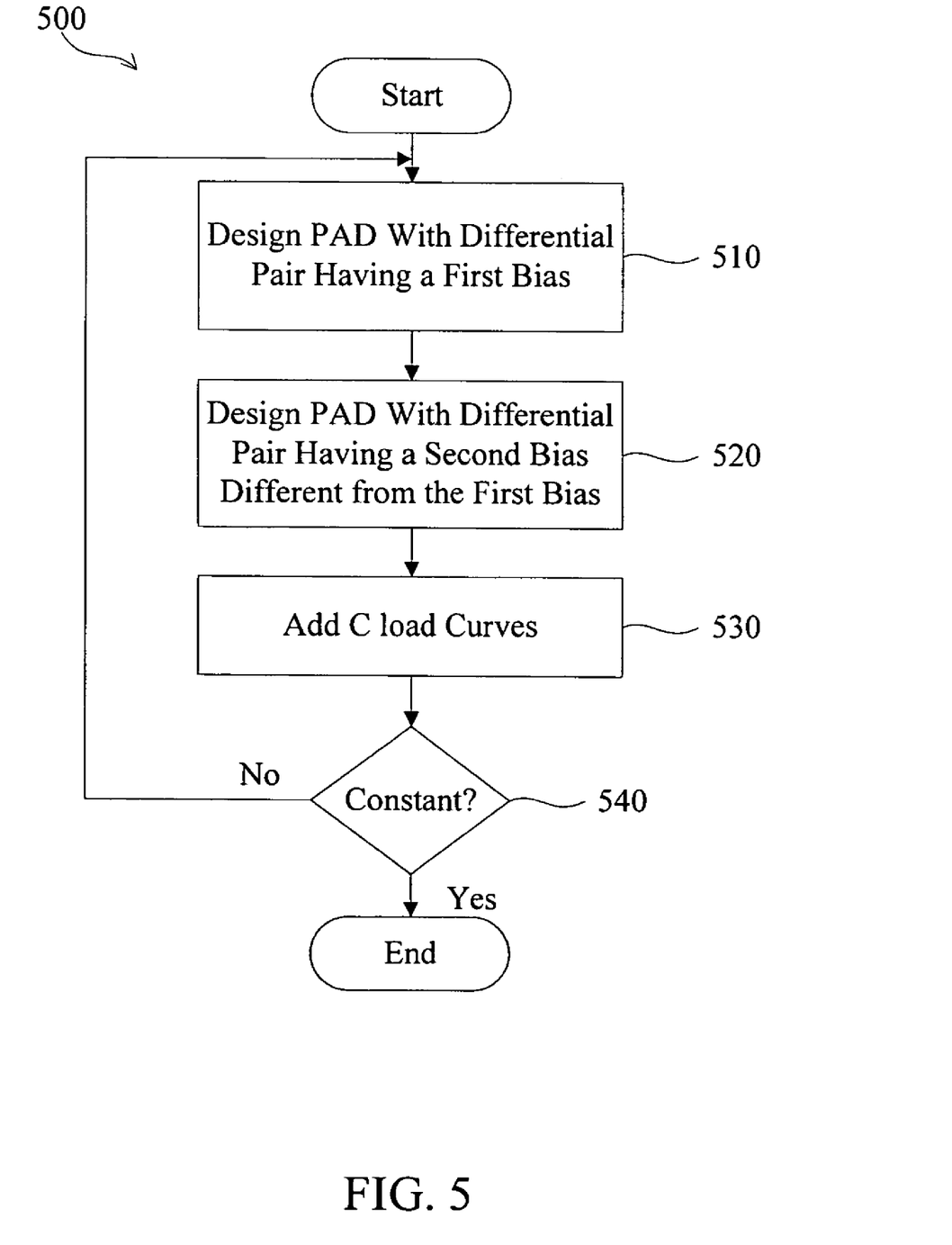
FIG. 5 is a flowchart illustrating a method of designing the PAD such that it is reducing phase distortion in PGA output.

FIG. 5 is a flowchart illustrating a method 500 of improving the constant of PAD input differential pair gate capacitance and reducing phase distortion in the PGA 240. First, simple PAD design (just like the differential pair 290A) is designed (510) with a first bias voltage for its differential pair. Its C load curve is then a function of the PGA output amplitude. Next, the other differential pair (290B) is designed (520) with a second bias voltage for its differential pair. Its C load curve is then a function of the PGA output amplitude. Then, the above two C-load curves are added (530) to see if they are constant (540) for the PGA output amplitude of interest. Finally, the designing (510 and/or 520) and adding (530) are repeated until the above criteria is met.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A power amplifier, comprising:
   two sets of differential pairs; and
   a differential inductor coupled to each of the differential pairs,
   wherein each of the differential pairs includes a bias transistor supplying a bias voltage to the power amplifier, the differential pairs each supplying a different bias voltage to bias their respective bias transistors to operating points in which their respective gate capacitances are both non-linear functions of their respective bias voltages, the gate capacitance of a first of the two sets of differential pairs increasing as the bias voltage increases at its respective operating point, and the gate capacitance of a second of the two sets of differential pairs decreasing as the bias voltage increases at its respective operating point.

2. The amplifier of claim 1, wherein output of the pairs are combined.

3. The amplifier of claim 1, wherein the amplifier tunes out parasitic capacitance.

4. The amplifier of claim 1, wherein each pair includes a positive and a negative branch.

5. The amplifier of claim 1, wherein one pair has a bias voltage in Class AB operation while the other pair has a bias voltage close to Class B operation.

6. A transmitter having an amplifier according to claim 1.

7. A method, comprising:
   presenting a load by two sets of differential pairs of a power amplifier, wherein the pairs are coupled to a differential inductor; and
   supplying different bias voltages to each of the differential pairs to bias transistors in the respective differential pairs to operating points in which their respective gate capacitances are both non-linear functions of their respective bias voltages, the gate capacitance of a first of the two differential pairs increasing as the bias voltage increases at its respective operating point, and the gate capacitance of a second of the two sets of differential pairs decreasing as the bias voltage increases at its respective operating point.

8. The method of claim 7, further comprising combining the output of the pairs.

9. The method of claim 7, wherein the amplifier tunes out parasitic capacitance.

10. The method of claim 7, wherein each pair includes a positive and a negative branch.

11. The method of claim 7, wherein one pair has a bias in Class AB operation while the other pair has a bias voltage close to Class B operation.

* * * * *

UNITED STATES PATENT AND TRADEMARK OFFICE
CERTIFICATE OF CORRECTION

PATENT NO.      : 7,616,931 B2                                              Page 1 of 1
APPLICATION NO. : 10/986141
DATED           : November 10, 2009
INVENTOR(S)     : Meng-An Pan It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1223 days.

Signed and Sealed this

Nineteenth Day of October, 2010

David J. Kappos
*Director of the United States Patent and Trademark Office*